(12) United States Patent
Rumreich et al.

(10) Patent No.: US 6,310,570 B1
(45) Date of Patent: Oct. 30, 2001

(54) SYSTEM WITH ADJUSTABLE ADC CLOCK PHASE

(75) Inventors: Mark Francis Rumreich; David Lawrence Albean; John William Gyurek, all of Indianapolis, IN (US)

(73) Assignee: Thomson Licensing S.A., Boulogne Cedex (FR)

( * ) Notice: Subject to any disclaimer, the term of this patent is extended or adjusted under 35 U.S.C. 154(b) by 0 days.

(21) Appl. No.: 09/327,088

(22) Filed: Jun. 4, 1999

(51) Int. Cl.[7] ..................................................... H03M 1/12
(52) U.S. Cl. .................................................................. 341/155
(58) Field of Search ..................................... 341/155, 111, 341/110, 163, 159

(56) References Cited

U.S. PATENT DOCUMENTS 6,005,507 * 12/1999 Nakatsu et al. ...................... 341/155

* cited by examiner

*Primary Examiner*—Brian Young
(74) *Attorney, Agent, or Firm*—J. S. Tripoli; E. P. Herrmann

(57) ABSTRACT

Analog to digital converters with enhanced performance in the presence of clock noise interference are configured with sampling clock phase selection circuitry to enable operation of the converter at the optimum sampling time intervals with respect to the interfering noise. The selection circuitry includes apparatus for generating a plurality of sampling clock phases and a multiplexer coupled to the plurality of phases to select the optimum clock phase.

14 Claims, 3 Drawing Sheets

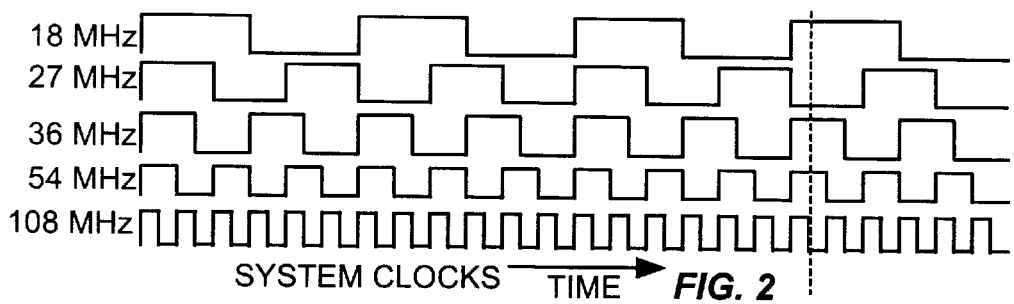
FIG. 2 SYSTEM CLOCKS
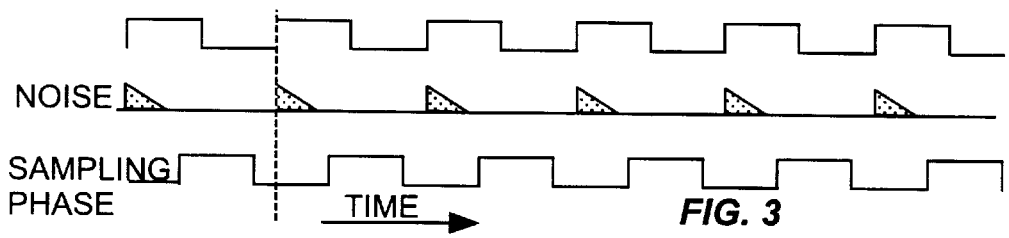
FIG. 3
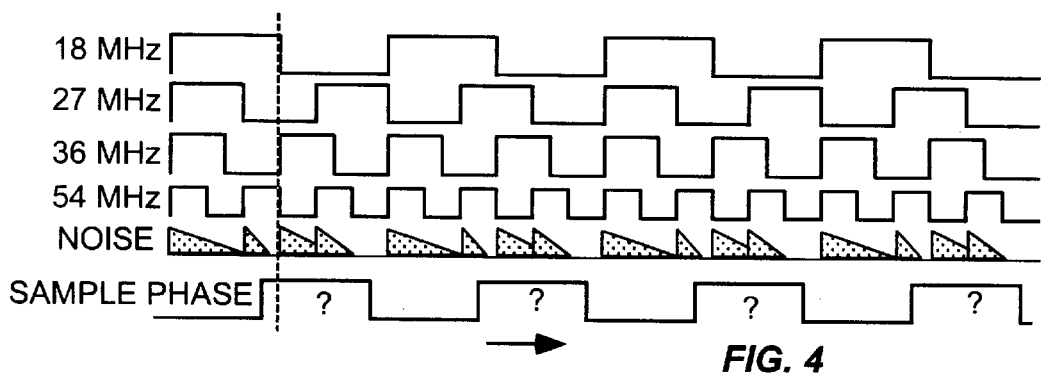
FIG. 4
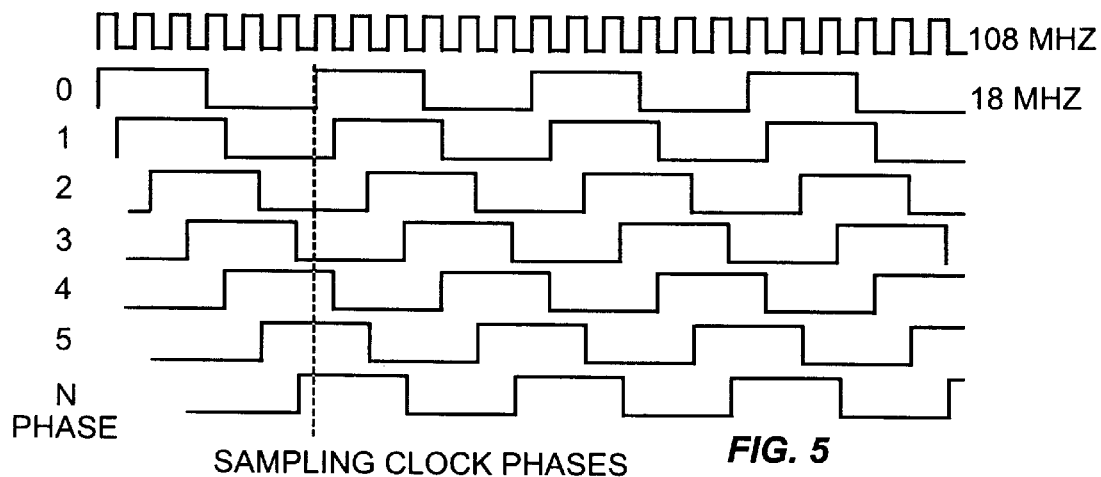
FIG. 5 SAMPLING CLOCK PHASES

SYSTEM WITH ADJUSTABLE ADC CLOCK PHASE

This invention relates to clocking analog to digital converters and more particularly phasing the clock signal to an analog to digital converter on an IC having a multiplicity of different clock signals.

BACKGROUND OF THE INVENTION

Digital processing integrated circuits (DSP's) containing a plurality of analog to digital converters (ADC's) are becoming prevalent. Frequently the DSP's will have a plurality of functional elements, with respective elements clocked at different frequencies, though the ADC's may be clocked at the same frequency. The relative proximity of respective ADC's to various of the functional elements may adversely affect the performance of the ADC. It is known that coupling of clocking signals from the functional elements or clock buses to the ADC either through the silicon substrate or via radiation will tend to degrade ADC performance, particularly if the ADC is operating near its maximum conversion rate.

Examples of DSP's containing a multiplicity of ADC's are multistandard interface circuits which condition signals in differing formats for processing by a common circuit element. A particular example is a television signal interface which conditions signal from different sources for digital processing and display. This interface may simultaneously accept NTSC signals from a broadcast receiver tuner, component analog television signals from a satellite or cable box, digitally broadcast VSB (vestigial sideband) signal from a further tuner etc. Nominally all of the signals will be converted from analog to digital form at a common sample rate and applied to respective processing elements for application to a display circuit. In the case of the digital VSB signal the processing will include digital decompression.

Depending on the format of the respective signals, different signal processing will be performed on the respective converted signal. The various processing functions may be performed at different clocking rates. Typically the ADC used to convert a signal of a particular format will be located in proximity of the processing element to which the converted signals applied. Depending on the clock frequencies utilized in the processing element and the relative nearness of the processing element to the ADC, ADC performance will be more or less affected.

In general the different clocking signals induce electrical noise in ADC conversion process, which in turn affects conversion speed, accuracy, and linearity. It is important to reduce the effects of clock signal or digitally induced noise on the analog or analog to digital circuitry.

In mixed analog-digital integrated circuitry it is known to take preventative measures to minimize effects of digital interference due to clock coupling. These measures include fabricating isolation guard rings around respective processing elements, and providing separate power buses to the different processing elements. Another technique includes the use of differential processing elements which may be arranged to reduce undesirable common mode signal.

SUMMARY OF THE INVENTION

Performance of respective ADC's on circuitry containing a plurality of processing elements, and a plurality of associated clock signals of differing frequencies is enhanced by generating ADC clocking signals of varying phase and selecting an optimum one of the clock phases for application to the ADC.

BRIEF DESCRIPTION OF THE DRAWINGS

FIG. 2 is a waveform diagram illustrating exemplary clocking signals which may be employed in the FIG. 1 circuitry.

FIG. 3 is a waveform diagram illustrating in part, analog to digital converter interference timing.

FIG. 4 is a waveform diagram illustrating in part, clock noise interference that multiple clocks may impose on analog to digital converters.

FIG. 5 is a waveform diagram of representative clock phases from which an optimum sampling clock phase may be selected

DETAILED DESCRIPTION

Figure 1:
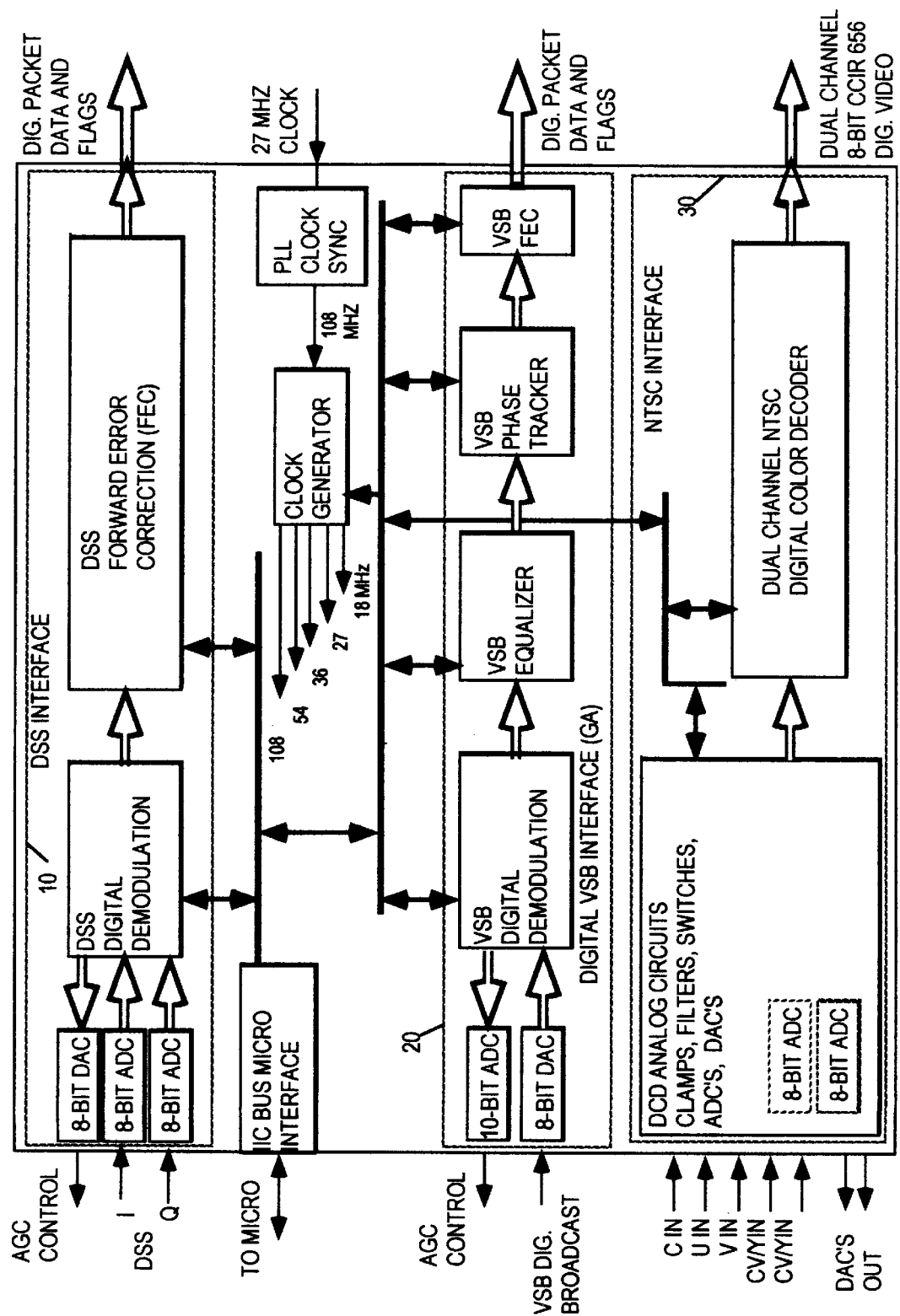
FIG. 1 is a block diagram of an interface circuit which includes a plurality of ADC's, and which is useful in describing the invention.

FIG. 1 is an interface integrated circuit which is useful in defining an environment of the invention, but is not restrictive. The invention may be practiced in any integrated circuit (IC) or other closely packed circuitry such as a multichip IC package or hybrid IC package incorporating analog to digital converters and where unpredictable noise interference may affect analog to digital performance. Other examples may include multiprocessor IC's for multimedia processing, multichannel digital audio processing/editing IC's and systems, just to name a couple.

FIG. 1 illustrates an interface or link IC for a multiplatform Television system. This IC is configured to simultaneously digitally process a plurality of television signals received in different formats. The respective processors are circumscribed with dashed lines. The circuitry circumscribed with dashed line 10 is configured to process digital direct broadcast satellite signal. This circuitry includes two analog to digital converters for processing quadrature signals from a satellite tuner, a digital demodulator and error correction circuitry. These elements may require different clocking signals such as for example, 18 MHz, 54 MHz and 27 MHz clock signals.

A second processing block circumscribed by the dashed line 20 receives and processes high definition digital signals such as may be transmitted according to the Grand Alliance protocol. This circuitry includes at least one analog to digital converter, a digital demodulator, an equalizer/phase tracker and error correction circuitry. These elements may require different clocking signals such as, for example, 108 MHz, 54 MHz and 18 MHz clock signals.

Thirdly, the IC includes an NTSC signal processor circumscribed by the dashed line 30. This circuitry includes at least two analog to digital converters, filter circuitry, and digital color decoders. These elements may require different clocking signals such as, for example, 18 MHz, 36 MHz and 27 MHz clock signals.

Nominally the respective clocking signals will be provided by common clock generation circuitry including a phase locked loop to develop a master clock signal and a generator responsive to the master clock signal for providing a plurality of clock signals at different frequencies. In the exemplary IC the master clock is at 108 MHz, and the further clock signals are at 18, 27, 36 and 54 MHz. FIG. 2 illustrates exemplary timing relationships of these clock signals. These particular clock signals are phase locked to each other and are all simple multiples of 9 MHz. It will be appreciated that a plurality of clock signals widely divergent from those illustrated may be employed in similar or different IC's, and to which the invention will apply.

In each of the circuits, the respective analog to digital converters will nominally be adjacent to its associated processing circuitry and thus susceptible to clock signal interference from its associated circuitry. Additionally, the respective analog to digital converters will be susceptible to clock signal interference coupled through the IC substrate and power interconnects. Each of the analog to digital converters, because of its relative location on the IC will likely be susceptible to differing clock interference, and which interference will be unpredictable.

To appreciate the problem solved by the present invention, consider FIG. 3. In FIG. 3 there are a top, a middle and a bottom waveform. The top waveform is intended to indicate a clock signal in the vicinity of an analog to digital converter which processes samples at the same frequency as clock signal. The middle waveform is intended to indicate interfering noise power incurred by an analog to digital converter from the clock signal represented by the top waveform. The illustrated noise power is only representational, and may take differing forms and amplitudes.

The lower waveform represents the optimum sampling phase for the sampling clock signal applied to the converter. In this example it is assumed that analog to digital converter sampling initiates on the positive going transition of the sampling clock, i.e. the bottom waveform, and continues until the negative going transition. Preferably the sampling phase is selected so no clock noise interference occurs during this entire interval. The optimum sampling phase that is shown was arbitrarily selected and is exemplary only, but one skilled in the art of analog to digital design will appreciate that sampling should occur after any interfering noise abates. Different types of analog to digital converters will respond differently regarding sampling clock phase and the occurrence of clock interference. However, for each type of analog to digital converter there will be an optimum clocking phase.

If a given system has a single interfering clock, the optimum sampling phase of a single analog to digital converter may be accurately predicted and generated. But consider the situation of an analog to digital converter located on an IC with plural associated digital circuits driven by a multiplicity of clocking signals. Exemplary clock waveforms and possible exemplary interfering clock noise of such a system is demonstrated in the waveforms of FIG. 4. The waveform designated NOISE shows potential noise interference generated by the positive transitions of all of the clock signals shown in FIG. 4. It will be appreciated that, on an integrated circuit, the interfering noise at any location will be different for the different sources depending on the clock signal coupling mechanism and the relative locations of the sources to the respective analog to digital converter. In FIG. 4 the waveform immediately below the noise waveform illustrates a possible optimum sampling clock waveform, the phase of which, relative to the other clock signals, is uncertain.

In general, it is not possible to predict the magnitude or power of clock noise that will interfere with the performance of an analog to digital converter. However, the inventors have determined that despite the unpredictability of interfering noise, there is an optimum sampling interval in which the converter should be operated. This interval can be determined by trial and error, or it may be determined automatically. In an automatic calibration mode, one or more predetermined input values are applied to the analog to digital converter and for each input value a plurality of sampling clock phases, such as the clock phases shown in FIG. 5, are used to operate the converter. Converter output samples are measured for errors. The clock phase producing the least output errors will be selected as the clock signal with optimum sampling phase.

Figure 6:
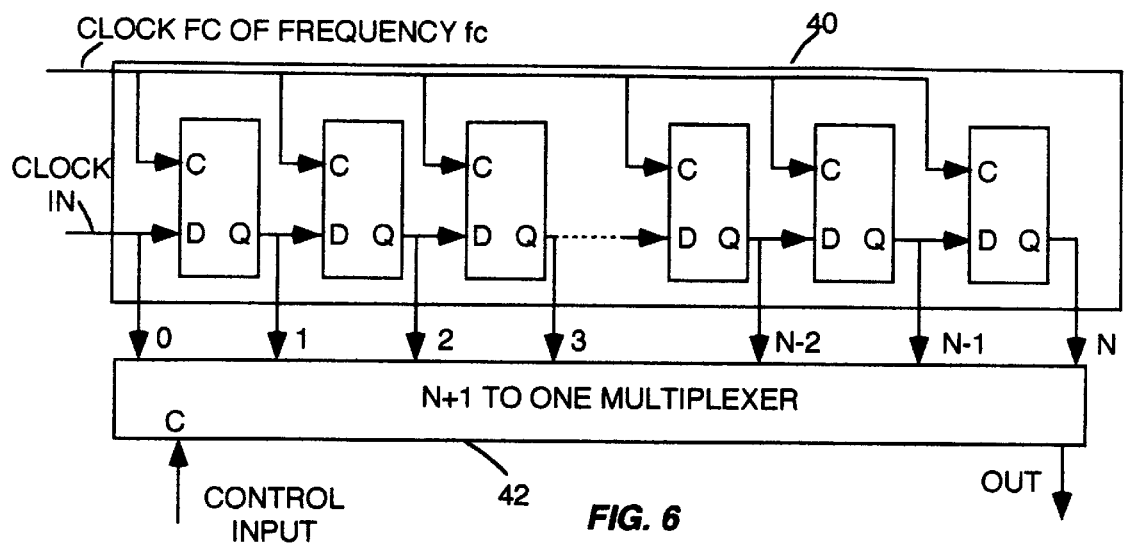
FIGS. 6 and 7 are alternative exemplary sampling clock phase generating circuitry.
Figure 7:
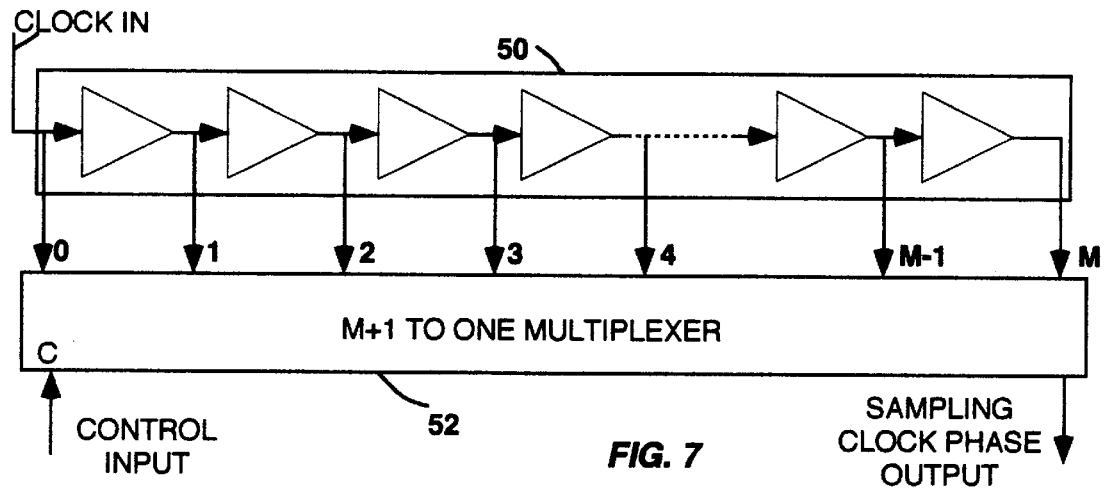

Circuitry for generating a plurality of clock phases, for application as sampling clock signal to an analog to digital converter, are shown in FIG. 6 and FIG. 7. FIG. 6 shows circuitry for developing various sampling clock phases which lag in equal increments and are synchronous with a master clock. In this circuit, a sampling clock is applied to the input of a tapped delay line or shift register 40, which may comprise a cascade connection of D-type (or other type e.g. RS) flip flops. The register 40 is clocked by a master clock signal of frequency higher than the sampling clock frequency. The sampling clock appears at the respective taps successively delayed by intervals defined by the frequency $f_c$ of the master clock $F_C$, i.e. by increments of $1/f_c$.

FIG. 5 illustrates a plurality of possible sampling clock output phases derived from the FIG. 6 system. The number and increments of the sampling clock phases are a matter of design choice.

The output taps of register 40 are applied to input connections of a N+1-to-1 multiplexer 42. The multiplexer 42 couples signal from one of the taps to its output connection responsive to control signals applied to its control input C. The control signal may be user generated or it may be generated via an auto calibration algorithm as indicated above.

FIG. 7 is a block diagram of alternative circuitry for generating successively delayed sampling clock phases. This circuit comprises a tapped analog delay line 50 of cascade connected analog delay circuits such as amplifiers (or they may be inverter circuits). In this instance the delay provided by respective amplifiers may be relatively short (in the order of nanoseconds) and corresponds to the inherent delay of the amplifier. Thus, sampling clock phases may be generated with a relatively fine vernier. Of course the respective delays may also be generated with relatively longer intervals with appropriate choice of circuit elements.

The delay line taps are coupled to the input connections of a M+1-to-1 multiplexer 52. The multiplexer 52 couples signal from one of the taps to its output connection responsive to control signals applied to its control input C. The control signal may be user generated or it may be generated via an auto calibration algorithm as indicated above.

In a further embodiment the input of the analog phase shift circuit (50, 52) may be coupled to the output of the digital phase shift circuit (40, 42) and the output sampling clock signal taken from the analog multiplexer 52. Coarse phase adjustment is performed in the digital shifter (40, 42) and fine phase adjustment may be performed in the analog shifter (50, 52).

There are many alternative clock phase adjusting circuits using delay lines and multiplexers, or counters and logic devices, or programmable logic array devices etc. Selection of the particular type will primarily depend on the IC fabrication technology and designer preference.

Figure 8:
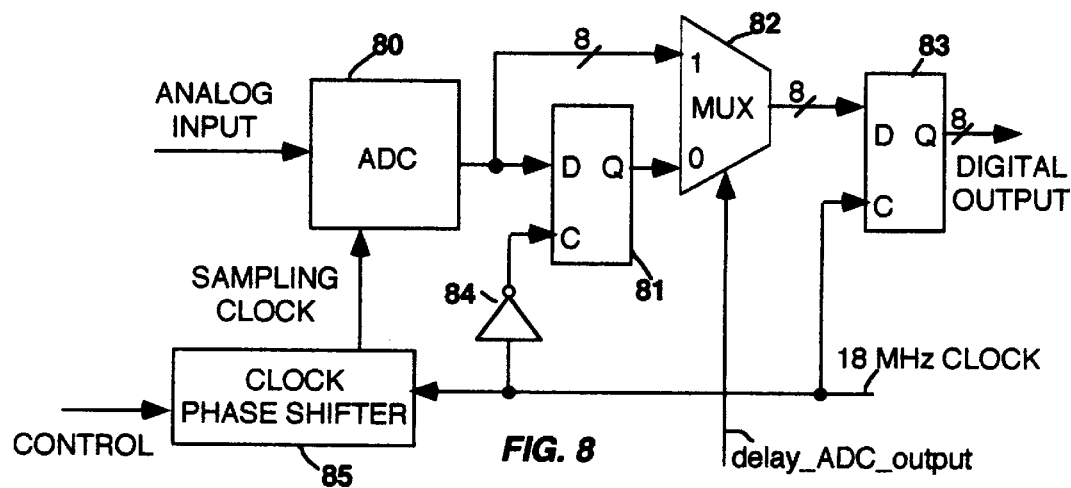
FIG. 8 is a block diagram of an analog to digital converter including a sampling clock phase generating circuit.

FIG. 8 illustrates an ADC system including an analog to digital converter 80 which has its sampling clock phase developed by a phase shifter 85, which may be configured as either the FIG. 6 or 7 circuits for example. The phase shifter 85 is responsive to an 18 MHz logic clock signal and develops the sampling clock therefrom. The digital output from the analog to digital converter 80 is directly coupled to a first input of a multiplexer 82 and to a second input of the multiplexer via a D-type flip flop. The output of the multiplexer is applied to a further D-type flip flop 83 for purposes of synchronization to the logic clock. The flip flop 83 is clocked by the 18 MHz clock signal, and the flip flop 81 is clocked by the complement of the 18 MHz clock signal. The multiplexer is statically controlled by a control signal delay_ADC_output, which may be provided on an I2C bus.

The flip flop 81 and the multiplexer 82 form a clock transfer circuit. This circuitry may be necessary by virtue of using a relatively large phase shifted sampling signal. When the selected sampling phase is such that the output of the analog to digital converter changes in the time vicinity of the rising edge of the 18 MHz logic clock, the delay_ADC_ control signal sets the multiplexer to couple its output to the analog to digital converter via the flip flop 81. This provides a half cycle of timing margin between the analog to digital converter output and the 18 MHz logic. Alternatively, if the selected sampling clock phase is selected such that the output of the analog to digital converter changes in the vicinity of the falling edge of the 18 MHz logic clock, then the delay_ADC_control signal conditions the multiplexer to couple its output directly to the analog to digital converter, as there is no significant timing misalignment.

The multiplexer delay_ADC_output control signal will be established concurrently with the sampling clock phase selection and will remain relatively static, unless the sampling phase selection is changing dynamically. In the latter case, the delay_ADC_output control signal must also be altered dynamically.

What is claimed is:

1. In digital circuit apparatus including an analog to digital converter, and processing circuitry responsive to clocking signals, further apparatus for deriving a clock signal for operating said analog to digital converter, comprising:

a source of a clock signal;

phase control circuitry coupled to said source for providing a clock signal of selected phase including;

a serial input-parallel output delay line connected to said source and having a plurality of output terminals, each successive output terminal providing input signal with different timing phase; and a multiplexer having respective parallel input terminals connected to the parallel output terminals of said delay line, an output terminal connected to said analog to digital converter for supplying said clock signal of adjusted phase and a control input terminal for applying a phase selection signal.

2. The further apparatus set forth in claim 1 wherein said multiplexer control terminal is coupled to an I2C bus for receiving control signals from a controller.

3. The apparatus set forth in claim 1 further including:

a delay register coupled to receive digital samples from said analog to digital converter; and a selector switch for selecting digital samples from said analog to digital converter, or delayed samples from the delay register coupled to said analog to digital converter.

4. The apparatus set forth in claim 3 wherein said selector switch is controlled by an I2C bus.

5. In an integrated circuit containing a plurality of analog to digital converters, a plurality of processor circuits coupled to output terminals of respective said converters and interconnections for a plurality of different frequency clock signals, further apparatus for deriving a clock signal for operating at least one of said analog to digital converters, comprising:

a source of an analog to digital clock signal;

phase control circuitry coupled to said source for providing a clock signal of selected phase including:

a serial input-parallel output delay line connected to said source and having a plurality of output terminals, each successive output terminal providing input clock signal with different timing phase; and a multiplexer having respective parallel input terminals connected to the parallel output terminals of said delay line, an output terminal connected to said analog to digital converter and a control input terminal.

6. The further apparatus set forth in claim 5 wherein said multiplexer control terminal is coupled to an I2C bus for receiving control signals from a controller.

7. The further apparatus set forth in claim 5 wherein said delay line is a clocked shift register.

8. The further apparatus set forth in claim 5 wherein said delay line is an analog delay line.

9. The further apparatus set forth in claim 5 including clock phase control circuitry for each of said analog to digital converters.

10. The further apparatus set forth in claim 5, further including:

a delay register coupled to receive digital samples from said at least one of said analog to digital converters; and a selector switch for selecting digital samples from said at least one of said analog to digital converters, or delayed samples from said delay register.

11. The further apparatus set forth in claim 9 wherein for each analog to digital converter:

a delay register is coupled to receive digital samples from each said analog to digital converter; and a selector switch is provided for selecting digital samples from respective said each analog to digital converter, or delayed samples from the delay register coupled to said analog to digital converter.

12. The further apparatus set forth in claim 11 wherein said selector switch is controlled by an I2C bus.

13. In digital circuit apparatus including an analog to digital converter, and processing circuitry responsive to clocking signals, further apparatus for deriving an ADC clock signal for operating said analog to digital converter, comprising:

a source of a clock signal;

phase control circuitry coupled to said source for adjusting the phase of the clock signal from said source with respect to the phase of at least one of said clocking signals, to generate said ADC clock signal; and means for connecting said ADC clock signal to operate said analog to digital converter.

14. In an integrated circuit containing a plurality of analog to digital converters, a plurality of processor circuits coupled to output terminals of respective said converters and a plurality of clock signals connected to operate said plurality of analog to digital converters, further apparatus for adjusting the phase of a clock signal connected to at least one of said analog to digital converters, comprising:

phase control circuitry coupled to receive one of said plurality of clock signals for providing a clock signal of selected phase offset with respect to at least one other of said plurality of clock signals; and means for connecting said clock signal of selected phase offset to operate said at least one analog to digital converter.

* * * * *